United States Patent
Lagarde et al.

(10) Patent No.: US 7,585,421 B2
(45) Date of Patent: Sep. 8, 2009

(54) METHOD OF PRODUCING A SHEET COMPRISING THROUGH PORES AND THE APPLICATION THEREOF IN THE PRODUCTION OF MICRONIC AND SUBMICRONIC FILTERS

(75) Inventors: Thierry Lagarde, Vif (FR); Jacques Pelletier, Saint Martin d'Heres (FR); Ana Lacoste, Saint-Martin-le-Vinoux (FR); Yves Alban-Marie Arnal, Poisat (FR)

(73) Assignee: Centre National de la Recherche Scientifique (CNRS), Paris (FR)

( * ) Notice: Subject to any disclaimer, the term of this patent is extended or adjusted under 35 U.S.C. 154(b) by 527 days.

(21) Appl. No.: 10/501,103

(22) PCT Filed: Jan. 7, 2003

(86) PCT No.: PCT/FR03/00020

§ 371 (c)(1),
(2), (4) Date: Feb. 15, 2006

(87) PCT Pub. No.: WO03/057352

PCT Pub. Date: Jul. 17, 2003

(65) Prior Publication Data

US 2006/0263548 A1    Nov. 23, 2006

(30) Foreign Application Priority Data

Jan. 7, 2002    (FR) .................................. 02 00118

(51) Int. Cl.
*H01B 13/00*    (2006.01)

(52) U.S. Cl. ............................... 216/17; 216/12; 216/27

(58) Field of Classification Search .................... 216/17, 216/36, 43, 56, 12, 27; 428/131
See application file for complete search history.

(56) References Cited

U.S. PATENT DOCUMENTS 5,728,261 A * 3/1998 Wolfe et al. .................. 438/719
5,753,014 A * 5/1998 Van Rijn ......................... 96/12
6,296,961 B1 * 10/2001 Moy et al. ..................... 429/27
6,478,968 B1 * 11/2002 Perrona et al. ............. 210/651

FOREIGN PATENT DOCUMENTS

WO    WO 0029167 A1 *    5/2000

* cited by examiner

*Primary Examiner*—Lan Vinh
(74) *Attorney, Agent, or Firm*—Blakely, Sokoloff, Taylor & Zafman LLP

(57) ABSTRACT

The method comprises the following steps:
  preparing a sheet having thickness of 5 μm to a few tens of micrometers, suitable for being etched by a lithographic operation;
  making a mask on a face of the sheet, the mask presenting etching selectivity S of at least 5;
  depositing a layer of photosensitive resin on the mask;
  making through holes in the layer of resin by photolithography;
  etching through the mask via the pores in the layer of resin; and
  anisotropically etching through the sheet from the pores in the mask in order to make pores in the sheet having an aspect ratio greater than 5.

Figure 1:
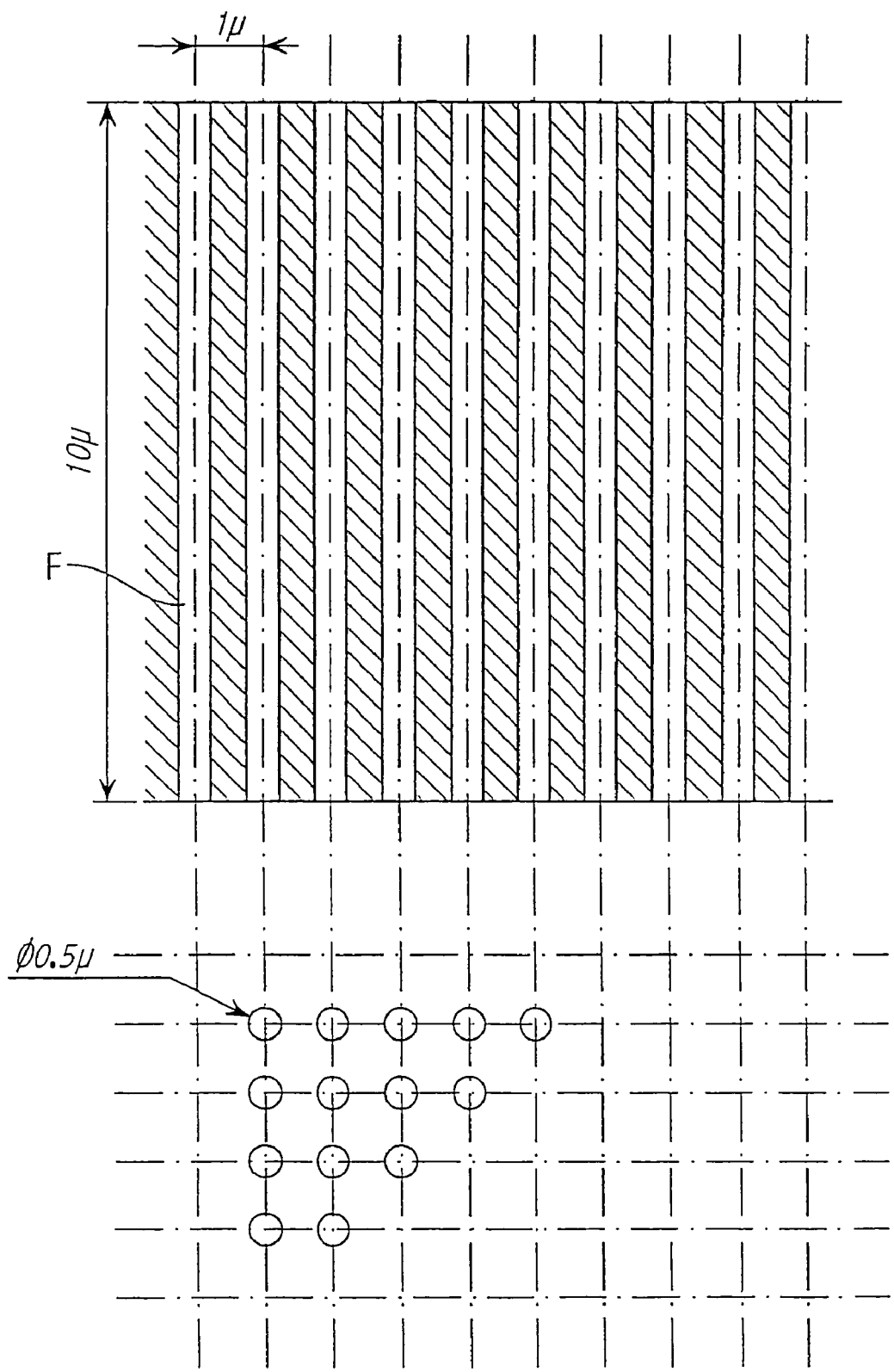

The invention is applicable to fabricating micron and sub-micron filters.

8 Claims, 2 Drawing Sheets

METHOD OF PRODUCING A SHEET COMPRISING THROUGH PORES AND THE APPLICATION THEREOF IN THE PRODUCTION OF MICRONIC AND SUBMICRONIC FILTERS

The present application is a non-provisional application of International Application No. PCT/FR03/00020, filed Jan. 7, 2003.

The invention relates to making sheets and membranes with through pores for making micron and sub-micron filters with calibrated cylindrical pores, and the invention also relates to sheets, membranes, and filters as obtained thereby.

The fields of application for such filters cover a very great variety of techniques such as filtering air and more generally gases, filtering liquid effluent and in particular cross-flow filtering, and filtering powders for separation or calibration purposes.

This type of filter finds applications in the food industry, in pharmacy, in the field of treating gaseous or liquid waste, in the field of producing and supplying pure gas free from dust, and more generally in all industrial fields that require separation and filtering steps.

Other fields of application such as VUV, UV, visible, IR, and X-ray optics can also find uses for arrays of pores (or holes) in materials that are dielectric, composite (photonic crystals), or metallic.

Various types of filter are made at present by a wide variety of techniques.

For cross-flow filtering, the filters must commonly in use are filters made of sintered alumina or zirconia on a support of alumina or graphite. In general they are in the form of tubes having porous walls with a diameter of centimeter (cm) order and with a length of 10 cm to 20 cm.

Filters made of sintered materials, although in use on a large scale, are relatively expensive and present various drawbacks and limitations. Firstly, the pores in sintered materials are not rectilinear, and on the contrary they are very tortuous and of section that varies along their paths. Pores having this geometry become clogged very quickly and also make it very difficult, if not impossible, to unclog filters by back-washing. Furthermore, sintered materials generally present pore mean diameters having a distribution that is relatively broad around a mean value.

The existence of such a distribution thus excludes filters of that type for applications that require great reliability in separation. Finally, the surface roughness that is intrinsic to sintered materials is not favorable for good fluid flow, in particular during cross-flow filtering. In addition, it is found difficult or even impossible to modify the physico-chemical nature of surfaces within the meanders of the pores.

Another well known technique is that of making thin porous films of polymer materials of the polysulfone type obtained by chemical etching that is preferential along the paths of ions that have been passed through the film by subjecting the film to a flow of very high energy ions in an accelerator.

In the technique making use of preferential chemical etching along the paths of ions in polysulfones that have been subjected to bombardment by high energy ions, the pores do indeed have trajectories that are rectilinear and their diameters depart little from their mean value (which depends on the duration of the chemical etching). Nevertheless, the distribution of the pores over the surface is random, such that two or more adjacent impacts of ions can lead to pores of diameters that are much greater than the diameter obtained from an isolated impact. Finally, thin films made of polysulfones are extremely fragile, which greatly limits the fields in which they can be used.

Another technique that is less well known consists in making holes through a plate of silicon by plasma etching the silicon through a mask, and then thinning down the plate until the holes pass right through it to form an array of pores.

For filters etched in silicon wafers, conventional lithographic and anisotropic plasma etching techniques (cf. for example, "Anisotropic etching of polymers in $SO_2/O_2$ plasmas" by Michel Pons, Jacques Pelletier, Olivier Joubert (J. Appl. Phys., 75(9), May 1, 1994)) enable an array of calibrated pores to be obtained at high density per unit area. Unfortunately, that technique presents several drawbacks and limitations, specifically: i) the need to thin down the wafer (typically from 500 micrometers (µm) to a fraction of a µm) in order to avoid excessive head loss in the flow passing through the filter; ii) the method is limited to the maximum dimensions of available wafers; iii) the starting material is exorbitantly expensive (a thick monocrystal), which cost is incomparable with the cost of filters used for industrial filtering; iv) such filters are fragile, being made of a brittle material (impacts, stresses); v) the resulting filters cannot be shaped (tubes, sealing); and vi) the filters present non-uniform resistance to corrosion (attack by solutions that are strongly basic, and also by certain acids).

An object of the invention is to make thin filter membranes presenting arrays of calibrated cylindrical pores at high density per unit area.

According to the invention, a filter membrane is made by a method which essentially comprises the following operations:

A) preparing a sheet having thickness of 5 µm to a few tens of micrometers, suitable for being etched by a lithographic operation;

B) making a mask on a face of the sheet, the mask presenting etching selectivity S of at least 5, where etching selectivity S is defined as the ratio of the speed VF at which the material of the sheet is etched to the speed VM at which the material of the mask is etched;

C) depositing a layer of photosensitive resin on the mask;

D) making through holes in the layer of resin by photolithography, matching the configuration of pores to be made;

E) etching through the mask via the pores in the layer of resin; and

F) anisotropically etching through the sheet from the pores in the mask in order to make pores in the sheet having an aspect ratio greater than 5, where aspect ratio is defined as the ratio of the depth of the pores to their diameter.

In preferred implementations, the method further comprises one or more of the following operations:

the method includes cutting the sheet up into individual membranes;

a sheet is used made of metal;

pores are made in the layer of resin by transferring an image of the configuration of the pores by interference;

said resin also constitutes the mask; and at least one of the etching operations is performed in a plasma.

If the sheet is too rough for the lithographic operation, its surface must be subjected to prior chemical or electrochemical polishing treatments.

To make a filter, the sheet, or the membrane cut out from the sheet, is used flat or rolled into a tube, and fixed to a support, in known manner.

Certain operations can be combined in a single step or may comprise a plurality of steps, for example making successive layers.

The starting sheet, which is preferably made of a metal, may be in the form of a sheet of large dimensions or a roll. In a variant, the sheet is made of a polymer or a composite material, or it is covered in a metal film.

The mask is made by any conventional means.

Carbon may advantageously be used as the pulverization mask since it generally presents pulverization yield that is much less than that of metals.

The image is made by depositing a layer of resin (photosensitive, electrosensitive, X-ray sensitive, etc.) and exposing the resin to a flux of energy (UV, photons, electrons, X-rays, etc.). The resin may optionally act simultaneously as resin and as a mask (as applies to resins silylized in an oxygen plasma).

In order to etch deeply with a very high aspect ratio in a plasma, it is possible to use:

1) either etching gases capable of forming volatile reaction products with the metal or the elements constituting the metal sheet or the film by chemical reaction induced by the ion bombardment. A necessary condition is that there must exist volatile compounds with the elements constituting the film that are stable;

2) or else gases that react little or not at all (pure or mixed inert gases) enabling the film to be pulverized by high energy ion bombardment.

In the first case, in order to obtain perfectly anisotropic plasma etching, it is possible to perform the following:

a) cryogenic etching which enables the rate of spontaneous chemical etching to be slowed down so as to make it practically zero;

b) etching with lateral passivation of the walls using a protective deposit for which the rate of spontaneous chemical etching is less than the rate of growth of the protective deposit;

c) etching with the rate of spontaneous reaction being blocked by competing absorption on the walls of a reactive element inhibiting spontaneous reactions; or d) etching with the rate of spontaneous reaction being blocked by steric effects (as applies to etching with halogens in which the radii of the atoms vary significantly).

The mask is removed after the etching operation, if necessary.

The membranes are preferably made in sheets or films that are continuous (polymers, metal foils) having width that is of meter (m) order and each supplying a plurality of membranes. Fabrication is preferably performed flat, in line, by the sheet traveling sequentially, by analogy with the collective fabrication methods used in micro-electronics. For each sequence, the sheet advances by one step, from one station to the following station, each station corresponding to a single operation or a single sub-operation in the fabrication method.

In order to make a tubular filter, the perforated membrane is rolled into a cylinder and its edges are then bonded together. Preferably, the zones that are to be used for bonding are free from pores, which means that they need to be protected during the operation of lithography or etching.

In order to make a flat filter, the membrane is optionally bonded to a support.

In addition to fabrication costs being very low as a result of an in-line fabrication method that enables high rates of throughput to be achieved, making filters from thin membranes in accordance with the invention presents numerous advantages, namely:

a) the number of fabrication steps is small (for example no thinning is required);

b) it is possible to make filters of any shape and size;

c) the filters are of good strength, in particular when made of metal;

d) the filters withstand high temperatures when they are made as films of refractory metal;

e) the filters present good resistance to corrosion as a function of the composition of the filter;

f) separation is very reliable due to the pores being accurately calibrated;

g) the surfaces of the filters present little roughness;

h) the filters present through pores that are cylindrical, making them highly suitable for unclogging by back-washing;

i) the lack of membranes along the pores makes it possible to envisage applying effective treatment to the surfaces of the pores by physico-chemical methods; and j) the high density per unit area of the pores enables large flow rates of material to be filtered (liquids, gases, powders).

The invention enables filters having high density per unit area of calibrated micron and sub-micron pores to be made.

The dimensions of the tubes may be identical to those of presently-available tubes. Wall thicknesses may lie in the range 5 µm to a few tens of micrometers, as a function of pore diameter. If pore diameter is small, then it is preferable to reduce pore length correspondingly (and thus membrane thickness), if it is desired to avoid excessively reducing the conductivity of the pores. Nevertheless, reducing the thickness of the film also makes it weaker, and that can require the use of mechanical reinforcement or supports (grids, etc.)

For microfiltration applications, it is necessary to have a wide range of pore diameters available, going from one-tenth of a micrometer or less up to several tens of micrometers. If pore diameter is equal to the distance between pores, then the density of the pores is determined by pore diameter: $10^8$ pores per square centimeter (pores/cm$^2$) for a pore diameter of 0.5 µm; $10^6$ pores/cm$^2$ for a pore diameter of 5 µm; $10^4$ pores/cm$^2$ for a pore diameter of 50 µm; etc.

Figure 2:
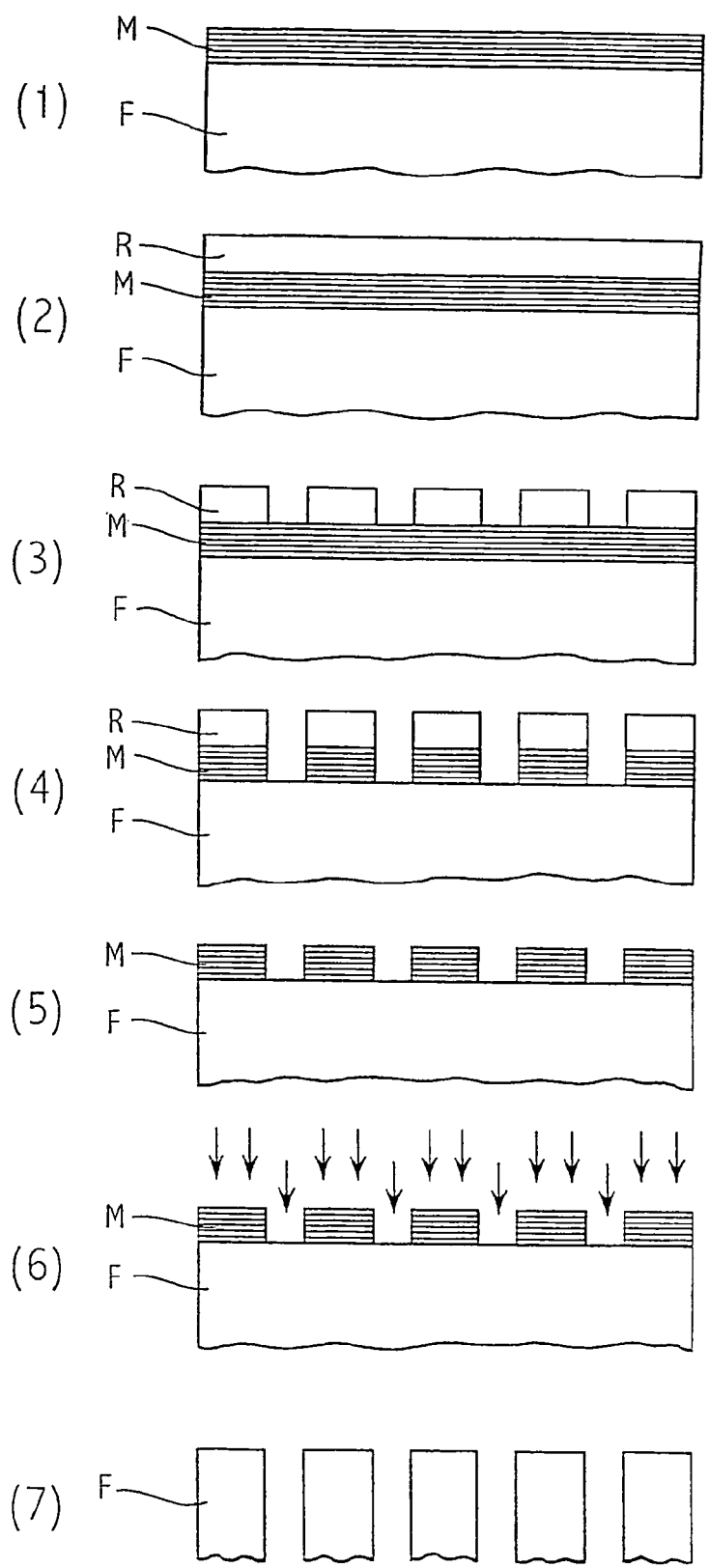

In the accompanying drawings:

FIG. 1 is a diagrammatic vertical section view and plan of a sheet including an array of pores made in accordance with the invention; and FIG. 2 is a diagram showing successive steps in an implementation of the fabrication method of the invention.

In FIG. 1, the top portion of the figure is a vertical section through a portion of a sheet including an array of pores, and the bottom portion of the figure is a plan view of a fragment of the sheet.

By way of example, the sheet was a metal sheet, e.g. a molybdenum sheet that was 10 micrometers thick, the pores formed a square array, each pore having a diameter of 0.5 micrometers, a depth of 10 micrometers (giving an aspect ratio of 20), and a spacing of 0.5 micrometers, i.e. a density per unit area of $10^8$ pores/cm$^2$.

The array was fabricated by performing the following steps (FIG. 2):

1) depositing on the sheet F a mask M constituted by a layer of aluminum having a thickness of 1 micrometer;

2) depositing a layer R of a photosensitive resin having a thickness of 1.2 micrometers on the mask;

3) transferring the image of the array of pores to the resin R by interference and developing the resin using a micro-electronic technique;

4) etching the mask through the pores of the layer of resin by means of a gas containing chlorine, bromine, or iodine;

5) removing the residual resin (optional);

6) anisotropically etching the film F by means of a gas based on fluorine passing through the pores in the mask; and 7) removing the mask (optional).

Each operation was performed while the sheet was stopped in a station in a sequence of stations through which the sheet was moved stepwise.

Optionally, a plurality of operations can be performed successively in the same station.

Thereafter, the sheet was cut up as a function of the dimensions of the filters so as to provide one or more membranes, and the membranes were secured on supports enabling the membranes to be used as filters.

The invention is not limited to this implementation, given purely for illustrative purposes.

The invention claimed is:

1. A method of fabricating a filter having calibrated through pores, the method comprising the following operations:
    A) using a continuous sheet having thickness of 5 μm to a few tens of micrometers, suitable for being etched by a lithographic operation;
    B) making a mask on a face of the sheet, the mask presenting etching selectivity S of at least 5, where etching selectivity S is defined as the ratio of the speed VF at which the material of the sheet is etched to the speed VM at which the material of the mask is etched;
    C) depositing a layer of photosensitive resin on the mask;
    D) making through holes in the layer of resin by photolithography, matching the configuration of pores to be made;
    E) etching through the mask via the pores in the layer of resin; and
    F) anisotropically etching through the sheet from the pores in the mask in order to make through pores in the sheet having an aspect ratio greater than 5, where aspect ratio is defined as the ratio of the depth of the pores to their diameter,
    the above-mentioned operations being performed in succession during sequential travel of the sheet.

2. A method according to claim 1, which includes after step F), cutting-up of the sheet up into individual membranes.

3. A method according to claim 1, in which a sheet is used made of metal.

4. A method according to claim 1, in which pores are made in the layer of resin by transferring an image of the configuration of the pores by interference.

5. A method according to claim 1, in which said resin also constitutes the mask.

6. A method according to claim 1, in which at least one of the etching operations is performed in a plasma.

7. A method according claim 1, the method including an operation of rolling the sheet or a membrane cut out from the sheet into a cylinder and bonding together its edges.

8. A method according to any one of claims 1-6 and 7, in which the through pores made in the sheet have a diameter lying in the range on one-tenth of a micrometer or less to several tens of micrometers.

* * * * *

UNITED STATES PATENT AND TRADEMARK OFFICE
CERTIFICATE OF CORRECTION

PATENT NO. : 7,585,421 B2  Page 1 of 1
APPLICATION NO. : 10/501103
DATED : September 8, 2009
INVENTOR(S) : Thierry Lagarde et al.

It is certified that error appears in the above-identified patent and that said Letters Patent is hereby corrected as shown below:

Column 6, Claim 2, line 11, after "sheet", delete "up"

Column 6, Claim 7, line 21, after "according", insert --to--

Column 6, Claim 8, line 24, delete "1-6 and 7" and insert --1 to 7--

Column 6, Claim 8, line 26, delete "on" and insert --of--

Signed and Sealed this

Twentieth Day of July, 2010

David J. Kappos
*Director of the United States Patent and Trademark Office*